US006933613B2

(12) United States Patent
Akashi

(10) Patent No.: US 6,933,613 B2
(45) Date of Patent: Aug. 23, 2005

(54) FLIP CHIP BALL GRID ARRAY PACKAGE

(75) Inventor: Tomoko Akashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 10/751,398

(22) Filed: Jan. 6, 2004

(65) Prior Publication Data

US 2004/0188827 A1 Sep. 30, 2004

(30) Foreign Application Priority Data

Jan. 7, 2003 (JP) ........................................ 2003-001487

(51) Int. Cl.⁷ ............................................ H01L 23/48
(52) U.S. Cl. .................. 257/778; 257/777; 257/700; 257/737; 257/686; 257/778; 438/667; 438/108; 438/613; 438/107
(58) Field of Search .............................. 257/700, 737, 257/709, 787, 778–780, 685, 675, 723, 718–719, 725–726, 796, 678, 774; 438/108, 118, 455, 106, 612–613, 667

(56) References Cited

U.S. PATENT DOCUMENTS

| 5,936,843 | A | * | 8/1999 | Ohshima et al. ............. 361/760 |
| 6,222,246 | B1 | * | 4/2001 | Mak et al. ................... 257/532 |
| 6,384,485 | B1 | * | 5/2002 | Matsushima ................. 257/778 |
| 6,410,431 | B2 | | 6/2002 | Bertin et al. |
| 6,518,093 | B1 | * | 2/2003 | Nakamikawa ............... 438/108 |
| 6,724,638 | B1 | * | 4/2004 | Inagaki et al. ............... 361/763 |
| 6,727,118 | B2 | * | 4/2004 | Lasky et al. ................. 438/108 |
| 6,744,128 | B2 | * | 6/2004 | Wu et al. ..................... 257/686 |
| 6,756,685 | B2 | * | 6/2004 | Tao ............................. 257/778 |
| 6,806,569 | B2 | * | 10/2004 | Breisch et al. ............... 257/728 |
| 6,809,421 | B1 | * | 10/2004 | Hayasaka et al. ............ 257/777 |
| 6,828,224 | B2 | * | 12/2004 | Iijima et al. ................. 438/622 |
| 6,853,559 | B2 | * | 2/2005 | Panella et al. ............... 361/764 |
| 6,861,740 | B2 | * | 3/2005 | Hsu ............................. 257/691 |
| 6,867,501 | B2 | * | 3/2005 | Shibata ........................ 257/778 |
| 6,872,589 | B2 | * | 3/2005 | Strandberg et al. .......... 438/106 |
| 2004/0000428 | A1 | * | 1/2004 | Lii et al. ..................... 174/260 |
| 2004/0089470 | A1 | * | 5/2004 | Shimoto et al. ............. 174/250 |
| 2004/0183213 | A1 | * | 9/2004 | Hsu et al. .................... 257/786 |

FOREIGN PATENT DOCUMENTS

JP   2000-349203   12/2000

OTHER PUBLICATIONS http://www.intel.co.jp/jp/products/desktop/processors/pentium4/index.htm, retrieved on Apr. 22, 2004.
http://www.intel.com/support/processors/sb/cs-009864.htm, retrieved on Apr. 21, 2004.

* cited by examiner

*Primary Examiner*—Long Pham
*Assistant Examiner*—Thao X. Le
(74) *Attorney, Agent, or Firm*—Finnegan, Henderson, Farabow, Garrett & Dunner, L.L.P.

(57) ABSTRACT

A semiconductor device is disclosed, which comprises a package board in which pads are formed on the upper side of a wiring board, a semiconductor chip in which first bumps are formed on the device-forming surface of the semiconductor chip, second bumps are formed on the back surface of the semiconductor chip, and the semiconductor chip is flipchip-connected to the package board, a capacitor-mounted board in which capacitors are mounted on the upper surface of the capacitor-mounted board, pads are formed on the back surface of the capacitor-mounted board, and the capacitor-mounted board is flipchip-connected to the semiconductor chip, an adhesive resin filled between the semiconductor chip and the package substrate and between the semiconductor chip and the capacitor-mounting board, resin package formed on the package substrate, and a ball grid array comprising a plurality of external terminal balls formed on the back surface of the package substrate.

18 Claims, 2 Drawing Sheets

FLIP CHIP BALL GRID ARRAY PACKAGE

CROSS-REFERENCE TO RELATED APPLICATIONS

This application is based upon and claims the benefit of priority from the prior Japanese Patent Application No. 2003-001487, filed Jan. 7, 2003, the entire contents of which are incorporated herein by reference.

BACKGROUND OF THE INVENTION

1. Field of the Invention

The invention relates to a semiconductor device and a method of assembling the same. More specifically, the invention relates to a semiconductor device having an FCBGA (flip chip ball grid array) package with a decoupling capacitor and a method of assembling the same. The semiconductor device and the assembling method are intended for use with DRAM-mixed system LSI and networking system LSI, for example.

2. Description of the Related Art

FIG. 6 is a cross-sectional view schematically showing an example of a conventional semiconductor device having an FCBGA package.

In the conventional semiconductor device, through-hole wires 61 are formed in a package board 60 of the FCBGA package. The through-hole wires 61 connect an upper surface to a back surface of the package board 60. Solder balls 62 are formed in a pattern of ball grid array (BGA) on the back surface of the package board 60. A semiconductor chip (die) 63 is flipchip-connected to the package board 60 in a manner that the semiconductor chip 63 is provided at a central region of the upper surface of the package board 60. A resin 64 is filled and cured between the package board 60 and the semiconductor chip 63. A spacer (stiffener) 65 is provided on the package board 60 to surround the periphery of the semiconductor chip 63. The spacer 65 is adhered to the package board 60 by an adhesive 66. A heat spreader/cover plate 67 is provided on the spacer 65 and the semiconductor chip 63 and adhered thereto. The heat spreader/cover plate 67 is formed of, for example, a Cu plate. The semiconductor chip 63 and the cover plate 67 are adhered together by a thermal paste 68, and the spacer 65 and the cover plate 67 are adhered together by an adhesive 66.

In general, when a semiconductor device of such a of type as above-described is mounted on a wiring board of application products, decoupling capacitors (not shown) for stabilizing power supply voltage are provided near a BGA (ball grid array) of an FCBGA package to enhance the signal integrity of the semiconductor device. It is preferable that the decoupling capacitors be provided near power supply lines. However, in the FCBGA package, outer lead balls OLB are provided in the BGA region, so that the decoupling capacitors cannot be provided near the power supply lines.

It is contemplated that the decoupling capacitors are provided at the central region of the BGA, without providing the outer lead balls at the central region. A microprocessor considered to have such a structure is disclosed in, for example, an Intel(R) Internet homepage, website hyperlink symbology omitted: Products and Supports—Intel(R) Pentium(R) 4 Processor. However, this structure limits the BGA disposition.

As described above, there is a problem with the conventional semiconductor device having the FCBGA package in that the decoupling capacitors cannot be provided near power-supply terminals, so that the signal integrity cannot be sufficiently enhanced. Also in the structure having the decoupling capacitors provided at the central region of the ball grid array, without disposing the outer lead balls at the central region, there arises the problem of limiting the BGA disposition.

BRIEF SUMMARY OF THE INVENTION

According to an aspect of the present invention, there is provided a semiconductor device comprising:

a package board formed of a wiring board, in which at least one of a plurality of through-hole wires and a plurality of via-hole wires are formed in the wiring board, the plurality of through-hole wires and the plurality of via-hole wires electrically connect an upper surface to a back surface of the wiring board, pads are formed on the upper side of the wiring board, and the pads are connected to the through-hole wires or the via-hole wires;

a semiconductor chip, in which a plurality of pads including power supply pads are formed on a device-forming surface of the semiconductor chip, bumps are formed on the plurality of pads, a plurality of through-hole wires are formed in the semiconductor chip, the plurality of through-hole wires electrically connect the device-forming surface side to a back surface side of the semiconductor chip, at least some of the power supply pads are connected to the plurality of through-hole wires, a plurality of pads are formed on the back surface and connected to the through-hole wires, bumps are formed on the pads formed on the back surface, and the semiconductor chip is flipchip-connected to the package board in a manner that the bumps on the device-forming surface of the semiconductor chip are provided opposite to the pads on the upper surface of the package board;

a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, pads connected to the through-hole wires are formed on a back surface and connected to the through-hole wires, and the capacitor-mounted board is flipchip-connected to the semiconductor chip in a manner that the pads on the capacitor-mounted board are provided opposite to the bumps on the back surface of the semiconductor chip;

an adhesive resin filled between the semiconductor chip and the package substrate and between the semiconductor chip and the capacitor-mounting board, the adhesive resin adhering the semiconductor chip to the package substrate and the semiconductor chip to the capacitor-mounting board;

a resin package formed on the package substrate, the resin package being formed of molding resin and covering a sidewall of the semiconductor chip, a sidewall of the capacitor-mounting board and upper surfaces of the capacitors; and a ball grid array comprising a plurality of external terminal balls formed on the back surface of the package substrate, the plurality of external terminal balls being connected to the one of the plurality of the through-hole wires and the plurality of the via-wires on the back surface of the package substrate.

According to another aspect of the present invention, there is provided a method of assembling a semiconductor device comprising:

forming a semiconductor chip, in which a plurality of pads including power supply pads are formed on a device-forming surface of the semiconductor chip, a plurality of through-hole wires are formed in the semiconductor chip, the plurality of through-hole wires extend from the device-forming surface to a back surface of the semiconductor chip, at least some of the power supply pads are connected to the plurality of through-hole wires, a plurality of pads are formed on the back surface and connected to the through-hole wires, first solder bumps are formed on the pads formed on the back surface;

forming a package board formed of a wiring board, in which at least one of a plurality of through-hole wires and a plurality of via-hole wires are formed in the wiring board, the plurality of through-hole wires and the plurality of via-hole wires electrically connect an upper surface to a back surface of the wiring board, first solder pads are formed on the upper side of the wiring board, and the first solder pads are connected to the through-hole wires or the via-hole wires;

flipchip-connecting the semiconductor chip to the package board in a manner that the first solder bump on the device-forming surface of the semiconductor chip are provided opposite to the first solder pads on the upper surface of the package board;

forming second solder bumps on the plurality of pads formed on the back surface of the semiconductor chip, after the semiconductor chip is flipchip-connected to the package board;

forming a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, second solder pads connected to the through-hole wires are formed on a back surface and connected to the through-hole wires;

flipchip-connecting the capacitor-mounted board to the semiconductor chip in a manner that the second solder pads on the back surface of the capacitor-mounted board are provided opposite to the second solder bumps on the back surface of the semiconductor chip;

filling an adhesive resin between the semiconductor chip and the package substrate and between the semiconductor chip and the capacitor-mounting board, to adhere the semiconductor chip to the package substrate and the semiconductor chip to the capacitor-mounting board;

forming a resin package with molding resin on the package substrate, to cover a sidewall of the semiconductor chip, a sidewall of the capacitor-mounting board and upper surfaces of the capacitors; and forming solder balls on the back surface of the package substrate to form a ball grid array.

According to a further aspect of the present invention, there is provided a semiconductor device comprising:

a package board formed of a wiring board, in which a plurality of through-hole wires and a plurality of via-hole wires are formed in the wiring board, the plurality of through-hole wires and the plurality of via-hole wires electrically connect an upper surface to a back surface of the wiring board, first pads and second pads are formed on the upper side of the wiring board, the first pads are connected to the through-hole wires and the second pads are connected to the via-hole wires;

a semiconductor chip, in which a plurality of pads including power supply pads are formed on a device-forming surface of the semiconductor chip, first bumps are formed on the plurality of pads, a plurality of through-hole wires are formed in the semiconductor chip, the plurality of through-hole wires electrically connect the device-forming surface side to a back surface side of the semiconductor chip, at least some of the power supply pads are connected to the plurality of through-hole wires, a plurality of pads are formed on the back surface and connected to the through-hole wires, second bumps are formed on the pads formed on the back surface, and the semiconductor chip is flipchip-connected to the package board in a manner that the first bumps on the device-forming surface of the semiconductor chip are provided opposite to the first pads and the second pads on the upper surface of the package board;

a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, third pads connected to the through-hole wires are formed on a back surface of the capacitor-mounted board and connected to the through-hole wires, and the capacitor-mounted board is flipchip-connected to the semiconductor chip in a manner that the third pads on the back surface of the capacitor-mounted board are provided opposite to the second bumps on the back surface of the semiconductor chip;

an adhesive resin filled between the semiconductor chip and the package substrate and between the semiconductor chip and the capacitor-mounting board, the adhesive resin adhering the semiconductor chip to the package substrate and the semiconductor chip to the capacitor-mounting board;

a resin package formed on the package substrate, the resin package being formed of molding resin and covering a sidewall of the semiconductor chip, a sidewall of the capacitor-mounting board and upper surfaces of the capacitors; and a ball grid array comprising a plurality of external terminal balls formed on the back surface of the package substrate, the plurality of external terminal balls being connected to the plurality of the through-hole wires or the plurality of the via-hole wires on the back surface of the package substrate.

According to a still further aspect of the present invention, there is provided a method of assembling a semiconductor device comprising:

forming a semiconductor chip, in which a plurality of pads including power supply pads are formed on a device-forming surface of the semiconductor chip, a plurality of through-hole wires are formed in the semiconductor chip, the plurality of through-hole wires extend from the device-forming surface to a back surface of the semiconductor chip, at least some of the power supply pads are connected to the plurality of through-hole wires, a plurality of pads are formed on the back surface and connected to the through-hole wires, first solder bumps are formed on the pads formed on the back surface;

forming a package board formed of a wiring board, in which a plurality of through-hole wires and a plurality of via-hole wires are formed in the wiring board, the plurality of through-hole wires electrically connect an upper surface to a back surface of the wiring board, the plurality of via-hole wires electrically connect an upper surface to a back surface of the wiring board, first solder pads and second solder pads are formed on the upper side of the wiring board, the first solder pads are connected to the through-hole wires; and the second solder pads are connected to the via-hole wires;

flipchip-connecting the semiconductor chip to the package board in a manner that the first bump on the device-forming surface of the semiconductor chip are provided opposite to the first solder pads and the second solder pads on the upper surface of the package board;

forming second solder bumps on the plurality of pads formed on the back surface of the semiconductor chip, after the semiconductor chip is flipchip-connected to the package board;

forming a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, third pads connected to the through-hole wires are formed on a back surface and connected to the through-hole wires;

flipchip-connecting the capacitor-mounted board to the semiconductor chip in a manner that the third pads on the back surface of the capacitor-mounted board are provided opposite to the second solder bumps on the back surface of the semiconductor chip;

filling an adhesive resin between the semiconductor chip and the package substrate and between the semiconductor chip and the capacitor-mounting board, to adhere the semiconductor chip to the package substrate and the semiconductor chip to the capacitor-mounting board;

forming a resin package with molding resin on the package substrate, to cover a sidewall of the semiconductor chip, a sidewall of the capacitor-mounting board and upper surfaces of the capacitors; and forming solder balls on the back surface of the package substrate to form a ball grid array.

DETAILED DESCRIPTION OF THE INVENTION

An embodiment of the present invention will be described hereinbelow in detail with reference to the drawings.

FIGS. 1 to 4 are schematic cross-sectional views for explaining major processing steps of an example of a method of assembling a semiconductor device according to an embodiment of the present invention. FIG. 5 is an enlarged cross-sectional view of a portion of the semiconductor device shown in FIG. 3, the portion being encircled by broken line in FIG. 3.

Figure 1:
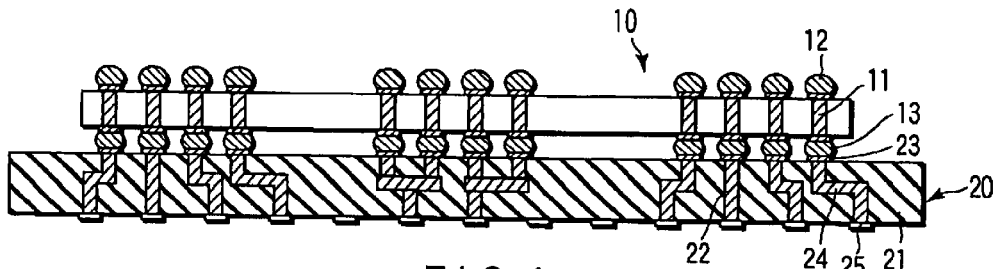
FIG. 1 is a schematic cross-sectional view for explaining a major processing step of an example of a method of assembling a semiconductor device according to an embodiment of the present invention.

First, a semiconductor chip (die) 10 and a package board (build-up board) 20 are formed, as shown in FIG. 1.

The semiconductor chip 10 has a device-forming surface and a back surface. Through-hole wires 11 are formed in the semiconductor chip 10. The through-hole wires 11 extend from the device-forming surface to the back surface of the semiconductor chip 10. A plurality of pads which include power supply pads are formed on the device-forming surface. At least some of the power supply pads are connected to through-hole wires 11 formed in the semiconductor chip 10. Also, a plurality of pads are formed on the back surface of the semiconductor chip 10.

First solder bumps 13 are formed on the pads on the device-forming surface. The first solder bumps 13 are provided by, for example, printing solder, on the pads formed on the device-forming surface.

The package board 20 is formed of a wiring board 21. Through-hole wires 22 and via-hole wires 24 are formed in the wiring board 21. The through-hole wires 22 and the via-hole wires 24 connect the upper surface to the back surface of the package board 20. A plurality of first solder pads 23 are formed on the upper surface of the wiring board 21. Similarly, a plurality of second solder pads 25 are formed on the back surface of the wiring board 21. The plurality of first solder pads 23 are connected to the through-hole wires 22 or the via-hole wires 24. Similarly, the plurality of second solder pads 25 are connected to the through-hole wires 22 or the via-hole wires 24.

In the present embodiment, the solder pads are columnar, and formed in a manner that solder is thickly applied by printing on a surface-treated metal pad, e.g. a surface-treated Al pad, subjected to re-flow, and then squashed to become flat.

The semiconductor chip 10 is flipchip-connected to the package board 20 such that the first solder bumps 13 on the device-forming surface of the semiconductor chip 10 are oppositely connected to the first solder pads 23 on the upper surface of the package board 20. After the flipflop-connection has been made, second solder bumps 12 are formed on the plurality of pads formed on the back surface of the semiconductor chip 10. When performing the flipflop-connection, heat is applied to the first solder bumps 13 and the first solder pads 23, whereby the first solder bumps 13 and the first solder pads 23 are melted and connected to one another.

Figure 2:
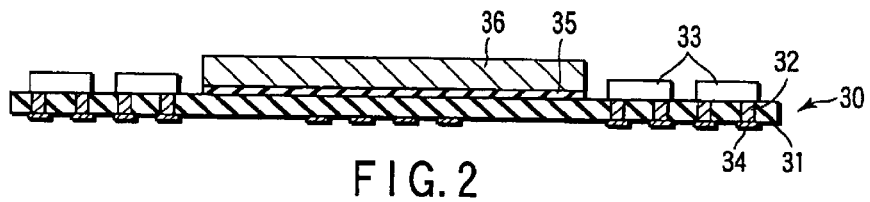
FIG. 2 is a schematic cross-sectional view for explaining another major processing step of the example of the assembly method of the semiconductor device according to the embodiment of the present invention.

On the other hand, a capacitor-mounting board 30 as shown in FIG. 2 is manufactured, independently of the process described with reference to FIG. 1 in which the flipchip structure of the semiconductor chip 10 and the package board 20 are formed. The capacitor-mounting board 30 is formed of a ceramic substrate 31, or alternatively, an organic substrate such as a resin substrate. Through-hole wires 32 are formed in the ceramic substrate 31. The through-hole wires 32 connect the upper surface to the back surface of the ceramic substrate 31. Capacitors 33, for example chip condensers, are mounted on an upper surface of the ceramic substrate 31. The capacitors 33 are each provided on the upper surface of the ceramic substrate 31 in such a manner that a pair of electrodes of the capacitor 33 are connected to pads 37 of printed wires provided on the upper surface of the ceramic substrate 31 and connected to the through-hole wires 32, as shown in FIG. 5. Third solder pads 34 are formed on the back surface (capacitor non-mounting surface) of the ceramic substrate 31. The third solder pads 34 are connected to the through-hole wires 32. The third solder pads 34 are each provided in a manner that solder is printed on a pad which is formed on the back surface of the ceramic substrate 31 and connected to the through-hole wire 32.

The disposition positions, the number, and the like of the capacitors 33 are not limited. However, it is preferable that the capacitors 33 are provided near the power supply pad of the semiconductor chip 10. A heat spreader 36 formed of, for example, a Cu plate is mounted on, for example, a central region of the upper surface of the capacitor-mounting board 30 via a thermal paste 35.

Figure 3:
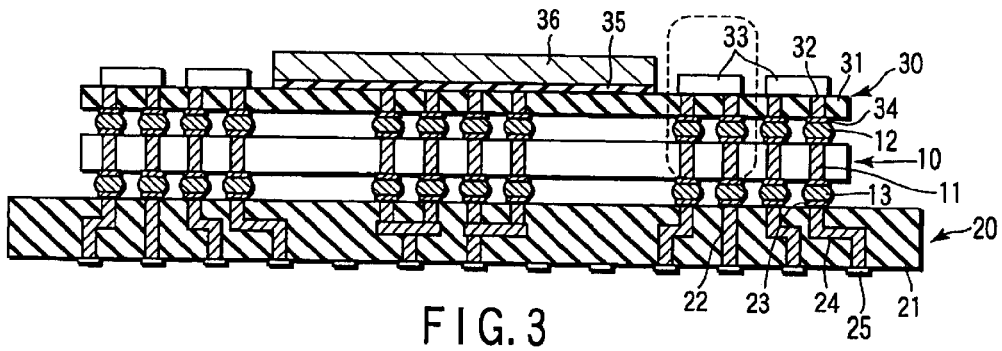
FIG. 3 is a schematic cross-sectional view for explaining a processing step following the processing steps, shown in FIGS. 1 and 2, of the example of the assembly method of the semiconductor device according to the embodiment of the present invention.

Then, as shown in FIG. 3, the capacitor-mounting board 30 is flipchip-connected to the semiconductor chip 10 in such a manner that the third solder pads 34 on the back surface of the capacitor-mounting board 30 are oppositely connected to the second solder bumps 12 on the back surface of the semiconductor chip 10.

Figure 4:
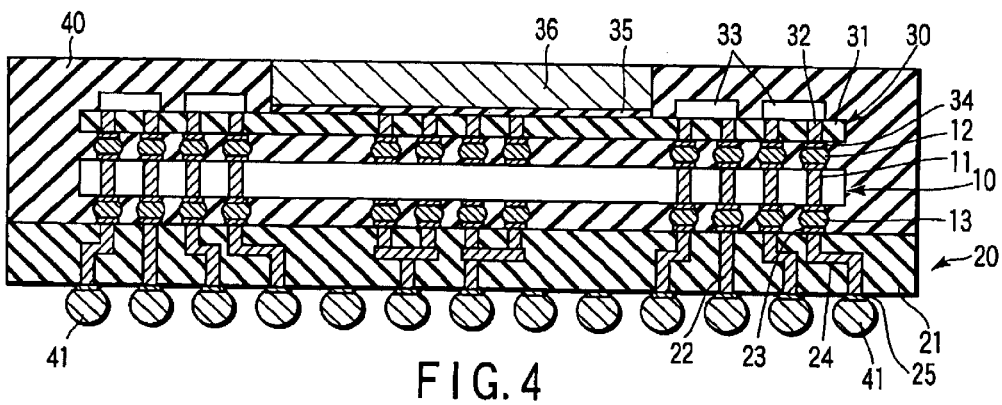
FIG. 4 is a schematic cross-sectional view for explaining a processing step following the processing step, shown in FIG. 3, of the example of the assembly method of the semiconductor device according to the embodiment of the present invention.
Figure 5:
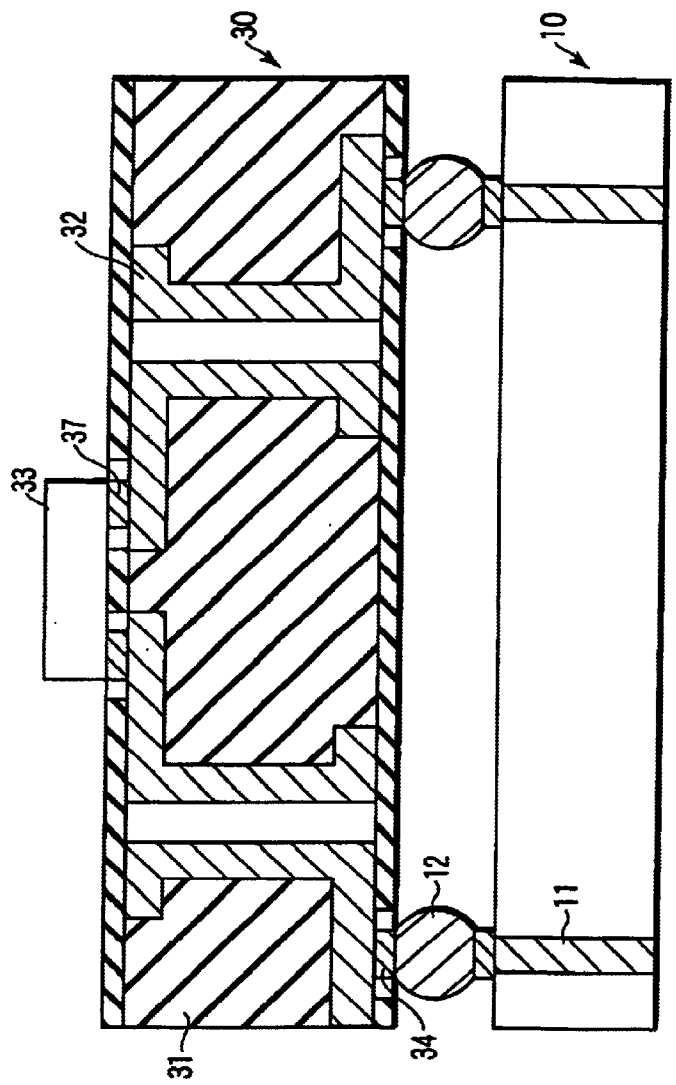
FIG. 5 is an enlarged cross-sectional view of a portion of the semiconductor device shown in FIG. 3.
Figure 6:
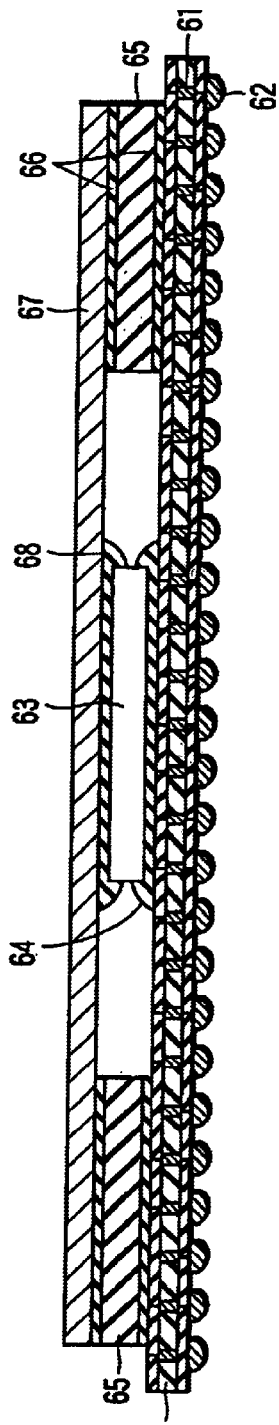
FIG. 6 is a schematic cross-sectional view for explaining an example of a conventional semiconductor device having an FCBGA package.

Thereafter, as shown in FIG. 4, an adhesive resin is filled between the semiconductor chip 10 and the package board 20 and between the semiconductor chip 10 and the capacitor-mounting board 30 to adhere the semiconductor chip 10 to the package board 20 and the semiconductor chip 10 to the capacitor-mounting board 30. Further, a mold resin is applied on the package board 20 to form a resin package 40 on the package board 20. The resin package 40 covers sidewalls of the semiconductor chip 10 and the capacitor-mounting board 30 and the upper surfaces of the capacitors 33. Then, solder balls 41 are formed on the second solder pads 25 on the back surface of the package board 20 to form ball grid array (BGA), thus completing the FCBGA package 40.

The semiconductor device shown in FIG. 4 is of double flip-chip package type wherein the semiconductor chip 10 and the package board 20 are flipchip-connected to each other, and similarly the semiconductor chip 10 and the capacitor-mounting board 30 are flipchip-connected to each other.

In FIG. 4, the package board 20 formed of the wiring board 21 has the through-hole wires 22 and via-hole wires 24 are formed in the wiring board 21. The through-hole wires 22 and the via-hole wires 24 connect the upper surface to the back surface of the wiring board 21. The plurality of first solder pads 23 and second solder pads 25 are formed on the upper surface and back surface of the package board 20, respectively, and connected to the through-hole wires 22 or the via-hole wires 24. Further, solder balls 41 as external terminals are formed in a BGA pattern on the back surface of the wiring board 21 via the second solder pads 25.

The semiconductor chip 10 mounted on the package board 20 has solder bumps 13 provided by printing solder on the pads formed on the device-forming surface. The plurality of pads include power supply pads, and at least some of the power supply pads are connected to the through-hole wires 11 formed in the semiconductor chip 10. Also, pads 12 are formed on the back surface of the semiconductor chip 10 and connected to the through-hole wires 11.

The semiconductor chip 10 is flipchip-connected to the package board 20 such that the first solder bumps 13 on the device-forming surface of the semiconductor chip 10 are oppositely connected to the first solder pads 23 on the upper surface of the package board 20. When performing the flipflop-connection, heat is applied to the solder bumps 13 and the solder pads 23, so that the first solder bumps 13 and the first solder pads 23 are melted and connected to each other.

On the other hand, the capacitor-mounting board 30 is formed of ceramic substrate 31, or alternatively, an organic substrate such as a resin substrate, and has the through-hole wires 32 formed in the ceramic substrate 31, which connect the upper surface to the back surface of the ceramic substrate 31. The heat spreader 36 formed of, for example, a Cu plate is mounted on the central region of the upper surface of the capacitor-mounting board 30 via the thermal paste 35. The capacitors 33, for example chip condensers, are mounted on the upper surface of the capacitor-mounting board 30, and the capacitors 33 are each provided on the upper surface of the ceramic substrate 31 in such a manner that a pair of electrodes of the capacitor 33 are connected to the pads 37 of printed wires provided on the upper surface of the ceramic substrate 31 and connected to the through-hole wires 32, as shown in FIG. 5.

The disposition positions, the number, and the like of the capacitors 33 are not limited. However, it is preferable that the capacitors 33 are each provided such that the electrodes of the capacitor 33 are connected near the power supply pad of the semiconductor chip 10 to stabilize the power supply voltage of the semiconductor chip 10.

The third solder pads 34 are formed on the back surface (capacitor non-mounting surface) of the ceramic substrate 31, and connected to the through-hole wires 32.

The capacitor-mounting board 30 is flipchip-connected to the semiconductor chip 10 in such a manner that the third solder pads 34 on the back surface of the capacitor-mounting board 30 are oppositely connected to the second solder bumps 12 on the back surface of the semiconductor chip 10.

When performing the flipflop-connection, heat is applied to the third solder pads 34 and the second solder bumps 12, so that the third solder pads 34 and the second solder bumps 12 are melted and connected to each other.

Adhesive resin is filled between the semiconductor chip 10 and the package board 20 and between the semiconductor chip 10 and the capacitor-mounting board 30 to adhere the semiconductor chip 10 to the package board 20 and the semiconductor chip 10 to the capacitor-mounting board 30. Further, a mold resin is applied on the package board 20 to form a resin package 40 on the package board 20. The resin package 40 covers sidewalls of the semiconductor chip 10 and the capacitor-mounting board 30 and the upper surfaces of the capacitors 33, thus forming the resin package.

As described referring to FIG. 4, with the adhering by adhesive resin and the sealing by mold resin, the mechanical strength of the FCBGA package is increased, and the reliability of the FCBGA package is enhanced against mechanical shocks from the outside.

It is preferable that the sizes of the semiconductor chip 10 and the capacitor-mounting board 30 is smaller than the size of the package board 20, and the sidewall of the mold resin 40 covering sidewalls of the semiconductor chip 10 and the capacitor-mounting board 30 is substantially aligned with the side wall of the package board 20. This makes it convenient for handling the FCBGA package after formation.

The height of the heat spreader 36 mounted on the upper surface of the capacitor-mounting board 30 is not limited. However, it is convenient to handle the FCBGA package after formation when the height of the heat spreader 36 is higher than the height of the capacitor 33.

In the FCBGA package of the embodiment described above, the capacitor-mounting board 30 is provided on the semiconductor chip 10. In other words, it is possible to provide the capacitors 33 on the capacitor-mounting board 30 without limiting the BGA disposition of the package board or the disposition of the power supply pads of the semiconductor chip 10. Hence, with the embodiment described above, it is possible that the decoupling capacitors are provided near the power supply pads of the semiconductor chip without changing the BGA arrangement of the FCBGA package.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a package board formed of a wiring board, in which at least one of a plurality of through-hole wires and a plurality of via-hole wires are formed in the wiring board, the plurality of through-hole wires and the plurality of via-hole wires electrically connect an upper surface to a back surface of the wiring board, pads are formed on the upper side of the wiring board, and the pads are connected to the through-hole wires or the via-hole wires;
    a semiconductor chip, in which a plurality of pads including power supply pads are formed on a device-forming surface of the semiconductor chip, bumps are formed on the plurality of pads, a plurality of through-hole wires are formed in the semiconductor chip, the plurality of through-hole wires electrically connect the device-forming surface side to a back surface side of the semiconductor chip, at least some of the power supply pads are connected to the plurality of through-hole wires, a plurality of pads are formed on the back surface and connected to the through-hole wires, bumps are formed on the pads formed on the back surface, and the semiconductor chip is flipchip-connected to the package board in a manner that the bumps on the device-forming surface of the semiconductor chip are provided opposite to the pads on the upper surface of the package board;
    a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, pads connected to the through-hole wires are formed on a back surface and connected to the through-hole wires, and the capacitor-mounted board is flipchip-connected to the semiconductor chip in a manner that the pads on the capacitor-mounted board are provided opposite to the bumps on the back surface of the semiconductor chip;
    an adhesive resin filled between the semiconductor chip and the package substrate and between the semiconductor chip and the capacitor-mounting board, the adhesive resin adhering the semiconductor chip to the package substrate and the semiconductor chip to the capacitor-mounting board;
    a resin package formed on the package substrate, the resin package being formed of molding resin and covering a sidewall of the semiconductor chip, a sidewall of the capacitor-mounting board and upper surfaces of the capacitors; and
    a ball grid array comprising a plurality of external terminal balls formed on the back surface of the package substrate, the plurality of external terminal balls being connected to said one of the plurality of the through-hole wires and the plurality of the via-wires on the back surface of the package substrate.

2. A semiconductor device according to claim 1, wherein the semiconductor device further comprises a heat spreader mounted on a predetermined region of the upper surface of the capacitor-mounting board via a thermal paste.

3. A semiconductor device according to claim 2, wherein the heat spreader is mounted on a central region of the upper surface of the capacitor-mounting board and the capacitors are mounted on the upper surface of the capacitor-mounting board to surround the periphery of the heat spreader.

4. A semiconductor device according to claim 1, wherein sizes of the semiconductor chip and the capacitor-mounting board are smaller than a size of the package board, and a sidewall of the mold resin covering sidewalls of the semiconductor chip and the capacitor-mounting board is substantially aligned with a side wall of the package board.

5. A semiconductor device according to claim 2, wherein a height of the heat spreader mounted on the upper surface of the capacitor-mounting board is higher than a height of the capacitors.

6. A method of assembling a semiconductor device comprising:
    forming a semiconductor chip, in which a plurality of pads including power supply pads are formed on a device-forming surface of the semiconductor chip, a plurality of through-hole wires are formed in the semiconductor chip, the plurality of through-hole wires extend from the device-forming surface to a back surface of the semiconductor chip, at least some of the power supply pads are connected to the plurality of through-hole wires, a plurality of pads are formed on the back surface and connected to the through-hole wires, first solder bumps are formed on the pads formed on the back surface;
    forming a package board formed of a wiring board, in which at least one of a plurality of through-hole wires and a plurality of via-hole wires are formed in the wiring board, the plurality of through-hole wires and the plurality of via-hole wires electrically connect an upper surface to a back surface of the wiring board, first solder pads are formed on the upper side of the wiring board, and the first solder pads are connected to the through-hole wires or the via-hole wires;
    flipchip-connecting the semiconductor chip to the package board in a manner that the first solder bump on the device-forming surface of the semiconductor chip are provided opposite to the first solder pads on the upper surface of the package board;

forming second solder bumps on the plurality of pads formed on the back surface of the semiconductor chip, after the semiconductor chip is flipchip-connected to the package board;

forming a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, second solder pads connected to the through-hole wires are formed on a back surface and connected to the through-hole wires;

flipchip-connecting the capacitor-mounted board to the semiconductor chip in a manner that the second solder pads on the back surface of the capacitor-mounted board are provided opposite to the second solder bumps on the back surface of the semiconductor chip;

filling an adhesive resin between the semiconductor chip and the package substrate and between the semiconductor chip and the capacitor-mounting board, to adhere the semiconductor chip to the package substrate and the semiconductor chip to the capacitor-mounting board;

forming a resin package with molding resin on the package substrate, to cover a sidewall of the semiconductor chip, a sidewall of the capacitor-mounting board and upper surfaces of the capacitors; and forming solder balls on the back surface of the package substrate to form a ball grid array.

7. A method of assembling a semiconductor device according to claim 6, wherein, in forming the capacitor-mounted board, the semiconductor device further comprises mounting a heat spreader on a predetermined region of the upper surface of the capacitor-mounting board via a thermal paste.

8. A semiconductor device according to claim 7, wherein, in forming the capacitor-mounted board, mounting the heat spreader on a central region of the upper surface of the capacitor-mounting board and mounting the capacitors on the upper surface of the capacitor-mounting board to surround the periphery of the heat spreader.

9. A method of assembling a semiconductor device according to claim 7, wherein a height of the heat spreader mounted on the upper surface of the capacitor-mounting board is higher than a height of the capacitors.

10. A semiconductor device comprising:

a package board formed of a wiring board, in which a plurality of through-hole wires and a plurality of via-hole wires are formed in the wiring board, the plurality of through-hole wires and the plurality of via-hole wires electrically connect an upper surface to a back surface of the wiring board, first pads and second pads are formed on the upper side of the wiring board, and the first pads are connected to the through-hole wires and the second pads are connected to the via-hole wires;

a semiconductor chip, in which a plurality of pads including power supply pads are formed on a device-forming surface of the semiconductor chip, first bumps are formed on the plurality of pads, a plurality of through-hole wires are formed in the semiconductor chip, the plurality of through-hole wires electrically connect the device-forming surface side to a back surface side of the semiconductor chip, at least some of the power supply pads are connected to the plurality of through-hole wires, a plurality of pads are formed on the back surface and connected to the through-hole wires, second bumps are formed on the pads formed on the back surface, and the semiconductor chip is flipchip-connected to the package board in a manner that the first bumps on the device-forming surface of the semiconductor chip are provided opposite to the first pads and the second pads on the upper surface of the package board;

a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, third pads connected to the through-hole wires are formed on a back surface of the capacitor-mounted board and connected to the through-hole wires, and the capacitor-mounted board is flipchip-connected to the semiconductor chip in a manner that the third pads on the back surface of the capacitor-mounted board are provided opposite to the second bumps on the back surface of the semiconductor chip;

an adhesive resin filled between the semiconductor chip and the package substrate and between the semiconductor chip and the capacitor-mounting board, the adhesive resin adhering the semiconductor chip to the package substrate and the semiconductor chip to the capacitor-mounting board;

a resin package formed on the package substrate, the resin package being formed of molding resin and covering a sidewall of the semiconductor chip, a sidewall of the capacitor-mounting board and upper surfaces of the capacitors; and a ball grid array comprising a plurality of external terminal balls formed on the back surface of the package substrate, the plurality of external terminal balls being connected to the plurality of the through-hole wires or the plurality of the via-hole wires on the back surface of the package substrate.

11. A semiconductor device according to claim 10, wherein the semiconductor device further comprises a heat spreader mounted on a predetermined region of the upper surface of the capacitor-mounting board via a thermal paste.

12. A semiconductor device according to claim 11, wherein the heat spreader is mounted on a central region of the upper surface of the capacitor-mounting board and the capacitors are mounted on the upper surface of the capacitor-mounting board to surround the periphery of the heat spreader.

13. A semiconductor device according to claim 10, wherein sizes of the semiconductor chip and the capacitor-mounting board are smaller than a size of the package board, and a sidewall of the mold resin covering sidewalls of the semiconductor chip and the capacitor-mounting board is substantially aligned with a side wall of the package board.

14. A semiconductor device according to claim 11, wherein a height of the heat spreader mounted on the upper surface of the capacitor-mounting board is higher than a height of the capacitors.

15. A method of assembling a semiconductor device comprising:

forming a semiconductor chip, in which a plurality of pads including power supply pads are formed on a device-forming surface of the semiconductor chip, a plurality of through-hole wires are formed in the semiconductor chip, the plurality of through-hole wires extend from the device-forming surface to a back surface of the semiconductor chip, at least some of the power supply pads are connected to the plurality of through-hole wires, a plurality of pads are formed on the back surface and connected to the through-hole wires, first solder bumps are formed on the pads formed on the back surface;

forming a package board formed of a wiring board, in which a plurality of through-hole wires and a plurality of via-hole wires are formed in the wiring board, the plurality of through-hole wires electrically connect an upper surface to a back surface of the wiring board, the plurality of via-hole wires electrically connect an upper surface to a back surface of the wiring board, first solder pads and second solder pads are formed on the upper side of the wiring board, the first solder pads are connected to the through-hole wires; and the second solder pads are connected to the via-hole wires;

flipchip-connecting the semiconductor chip to the package board in a manner that the first bump on the device-forming surface of the semiconductor chip are provided opposite to the first solder pads and the second solder pads on the upper surface of the package board;

forming second solder bumps on the plurality of pads formed on the back surface of the semiconductor chip, after the semiconductor chip is flipchip-connected to the package board;

forming a capacitor-mounted board formed of an organic substrate or a ceramic substrate, in which through-hole wires are formed in the capacitor-mounted board, the through-hole wires electrically connect an upper surface to a back surface of the capacitor-mounted board, capacitors are mounted on the capacitor-mounted board in a manner that electrodes of the capacitors are connected to printed wires connected to the through-hole wires, third pads connected to the through-hole wires are formed on a back surface and connected to the through-hole wires;

flipchip-connecting the capacitor-mounted board to the semiconductor chip in a manner that the third pads on the back surface of the capacitor-mounted board are provided opposite to the second solder bumps on the back surface of the semiconductor chip;

filling an adhesive resin between the semiconductor chip and the package substrate and between the semiconductor chip and the capacitor-mounting board, to adhere the semiconductor chip to the package substrate and the semiconductor chip to the capacitor-mounting board;

forming a resin package with molding resin on the package substrate, to cover a sidewall of the semiconductor chip, a sidewall of the capacitor-mounting board and upper surfaces of the capacitors; and forming solder balls on the back surface of the package substrate to form a ball grid array.

16. A method of assembling a semiconductor device according to claim 15, wherein, in forming the capacitor-mounted board, the semiconductor device further comprises mounting a heat spreader on a predetermined region of the upper surface of the capacitor-mounting board via a thermal paste.

17. A semiconductor device according to claim 16, wherein, in forming the capacitor-mounted board, mounting the heat spreader on a central region of the upper surface of the capacitor-mounting board and mounting the capacitors on the upper surface of the capacitor-mounting board to surround the periphery of the heat spreader.

18. A method of assembling a semiconductor device according to claim 16, wherein a height of the heat spreader mounted on the upper surface of the capacitor-mounting board is higher than a height of the capacitors.

* * * * *